(12) United States Patent
Beghein

(10) Patent No.: US 7,009,432 B2
(45) Date of Patent: Mar. 7, 2006

(54) SELF-CALIBRATING PHASE LOCKED LOOP CHARGE PUMP SYSTEM AND METHOD

(75) Inventor: Christophe C. Beghein, Kent (GB)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/131,863

(22) Filed: Apr. 25, 2002

(65) Prior Publication Data

US 2003/0117189 A1    Jun. 26, 2003

Related U.S. Application Data

(60) Provisional application No. 60/342,427, filed on Dec. 20, 2001.

(51) Int. Cl.
    *H03L 7/06*    (2006.01)
(52) U.S. Cl. .................................................. 327/157
(58) Field of Classification Search ............... 327/157, 327/148, 150, 159, 162, 306, 316, 318, 323, 327/331, 332, 363, 378, 536–538, 543, 560–562, 327/589, 156; 375/374; 257/299; 331/16
See application file for complete search history.

(56) References Cited

U.S. PATENT DOCUMENTS

| | | | | |
|---|---|---|---|---|
| 4,689,581 A | | 8/1987 | Talbot .......................... 331/1 A |
| 4,814,726 A | | 3/1989 | Byrd et al. .................. 331/1 A |
| 5,166,641 A | | 11/1992 | Davis et al. ................ 331/1 A |
| 5,184,028 A | | 2/1993 | Zobel ............................ 307/270 |
| 5,220,294 A | * | 6/1993 | Ichikawa ...................... 331/17 |
| 5,382,922 A | * | 1/1995 | Gersbach et al. ........... 331/1 A |
| 5,420,545 A | | 5/1995 | Davis et al. .................. 331/17 |
| 5,473,283 A | | 12/1995 | Luich ............................. 331/8 |
| 5,508,660 A | * | 4/1996 | Gersbach et al. ............. 331/17 |
| 5,576,647 A | | 11/1996 | Sutardja et al. ............. 327/108 |
| 5,696,468 A | * | 12/1997 | Nise .............................. 331/14 |
| 5,731,723 A | * | 3/1998 | Chen .......................... 327/157 |
| 5,760,640 A | * | 6/1998 | Girard et al. ............... 327/543 |
| 5,942,949 A | * | 8/1999 | Wilson et al. ................ 331/17 |
| 5,955,928 A | * | 9/1999 | Smith et al. .................... 331/2 |
| 6,107,889 A | | 8/2000 | Strange et al. ................ 331/17 |
| 6,111,468 A | * | 8/2000 | Tanishima .................... 331/17 |
| 6,118,346 A | * | 9/2000 | Olgaard ....................... 331/17 |
| 6,172,571 B1 | | 1/2001 | Moyal et al. ................. 331/11 |
| 6,175,282 B1 | * | 1/2001 | Yasuda ........................ 331/44 |
| 6,181,210 B1 | | 1/2001 | Wakayama ..................... 331/8 |
| 6,229,362 B1 | * | 5/2001 | Choi .......................... 327/157 |
| 6,329,872 B1 | * | 12/2001 | Foroudi ...................... 327/541 |
| 6,445,211 B1 | * | 9/2002 | Saripella ...................... 326/83 |
| 2002/0176188 A1 | * | 11/2002 | Ruegg et al. ................. 360/46 |

FOREIGN PATENT DOCUMENTS

| EP | 0 561 526 A2 | 3/1993 |
|---|---|---|
| EP | 0 778 510 A1 | 6/1997 |
| EP | 0 986 178 A2 | 3/2000 |

\* cited by examiner

*Primary Examiner*—Quan Tra
(74) *Attorney, Agent, or Firm*—Gauthier & Connors LLP

(57) ABSTRACT

A charge pump circuit is disclosed that includes a positive current output circuit for providing a positive current to an output of the charge pump circuit, a negative current output circuit for providing a negative current to the output of the charge pump circuit, and a calibration unit for permitting the charge pump circuit to be adjusted to reduce any current mismatch between the positive and negative currents and to provide that any current mismatch is integrated into a PLL loop filter capacitance.

10 Claims, 4 Drawing Sheets

… … …

SELF-CALIBRATING PHASE LOCKED LOOP CHARGE PUMP SYSTEM AND METHOD

This application claims priority to U.S. Provisional Patent Application Ser. No. 60/342,427 filed Dec. 20, 2001.

BACKGROUND OF THE INVENTION

The invention relates to frequency synthesizers, and relates in particular to charge pump circuits for use in a phase locked loop frequency synthesizer.

Frequency synthesizers may be used, for example, in radio frequency communication systems. Phase locked loops (PLLs) may be used in myriad applications including frequency synthesizers, as well as data recovery and clock recovery in further communication systems.

Typically, a PLL having a charge pump (a type II PLL) includes a phase detector, a charge pump circuit, a loop filter and a voltage-controlled oscillator (VCO). The phase detector detects differences in phase between an input reference signal and a feedback signal from the VCO. The charge pump circuit generates either a positive current source, e.g., of fixed value $I_{UP}$, to add charge to the loop filter or a negative current source, e.g., of a fixed value $I_{DOWN}$, to remove charge from the loop filter responsive to an error signal that is output by the phase detector. The VCO uses the control voltage across the loop filter to minimize the frequency difference between the PLL feedback signal and the input reference signal.

The performance of the PLL frequency synthesizer will depend on the performance of the charge pump circuit. In certain applications, it is important that the charge pump circuit provide very closely matched up ($I_{UP}$) and down ($I_{DOWN}$) fixed currents for balancing. An approach to providing matched currents in a PLL charge pump circuit is to provide separate reference and replication feedback circuits. For example, U.S. Pat. No. 6,107,889 discloses a charge pump circuit 200 for a frequency synthesizer that includes a reference current loop 202 that produces a bias current that flows through transistor 208, and a replication loop 204 that includes two feedback loops that force an output transistor 230 to have the same bias condition as a transistor 228 as shown in FIG. 1. The circuit 200 utilizes the second feedback replication loop 204 as well as the reference current loop 202 to establish identical bias conditions on the transistor 208 as an output transistor 214. The current sources of the circuit 200 are well matched, particularly if the components are matched. If, however, some components are not well matched (e.g., transistors 208 and 214 are not well matched or transistors 228 and 230 are not well matched), then the circuit 200 may not provide sufficiently matched current sources in certain situations.

There is a need, therefore, for a charge pump circuit that provides matched source currents when the components of the circuit are not matched.

There is also a need for a charge pump circuit that is efficient and economical to produce.

SUMMARY OF THE INVENTION

The invention provides a charge pump circuit including a positive current output circuit for providing a positive current to an output of the charge pump circuit, a negative current output circuit for providing a negative current to the output of the charge pump circuit, and a calibration unit for permitting the charge pump circuit to be adjusted to reduce any current mismatch between the positive and negative currents and to provide that any current mismatch is integrated into a phase locked loop filter capacitance.

In an embodiment, the circuit includes a reference current circuit and a replication feedback circuit. The reference current circuit is operable for defining a reference current through a first biasing transistor and having a first low output impedance associated therewith. The reference current circuit is coupled to a first output transistor to provide a negative current to an output of the charge pump circuit. The replication feedback circuit coupled to the reference current circuit at a coupling node and operable for replicating the output voltage at the coupling node such that the reference current is defined in a second biasing transistor and having a second low impedance. The replication feedback circuit is coupled to a second output transistor to provide a positive current to the output of the charge pump circuit.

BRIEF DESCRIPTION OF THE DRAWINGS

The following description may be further understood with reference to the accompanying drawing in which.

The drawings are shown for illustrative purposes.

DETAILED DESCRIPTION OF THE ILLUSTRATED EMBODIMENT

Figure 1:
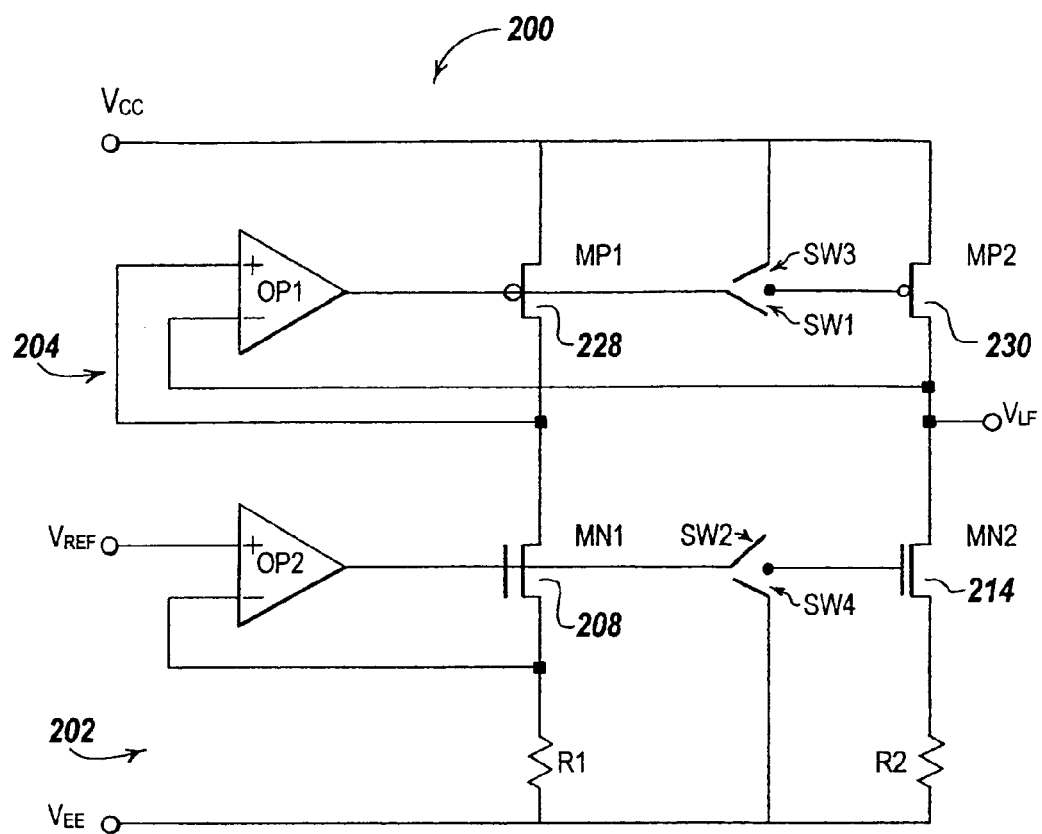
FIG. 1 shows an illustrative view of a prior art charge pump circuit.
Figure 2:
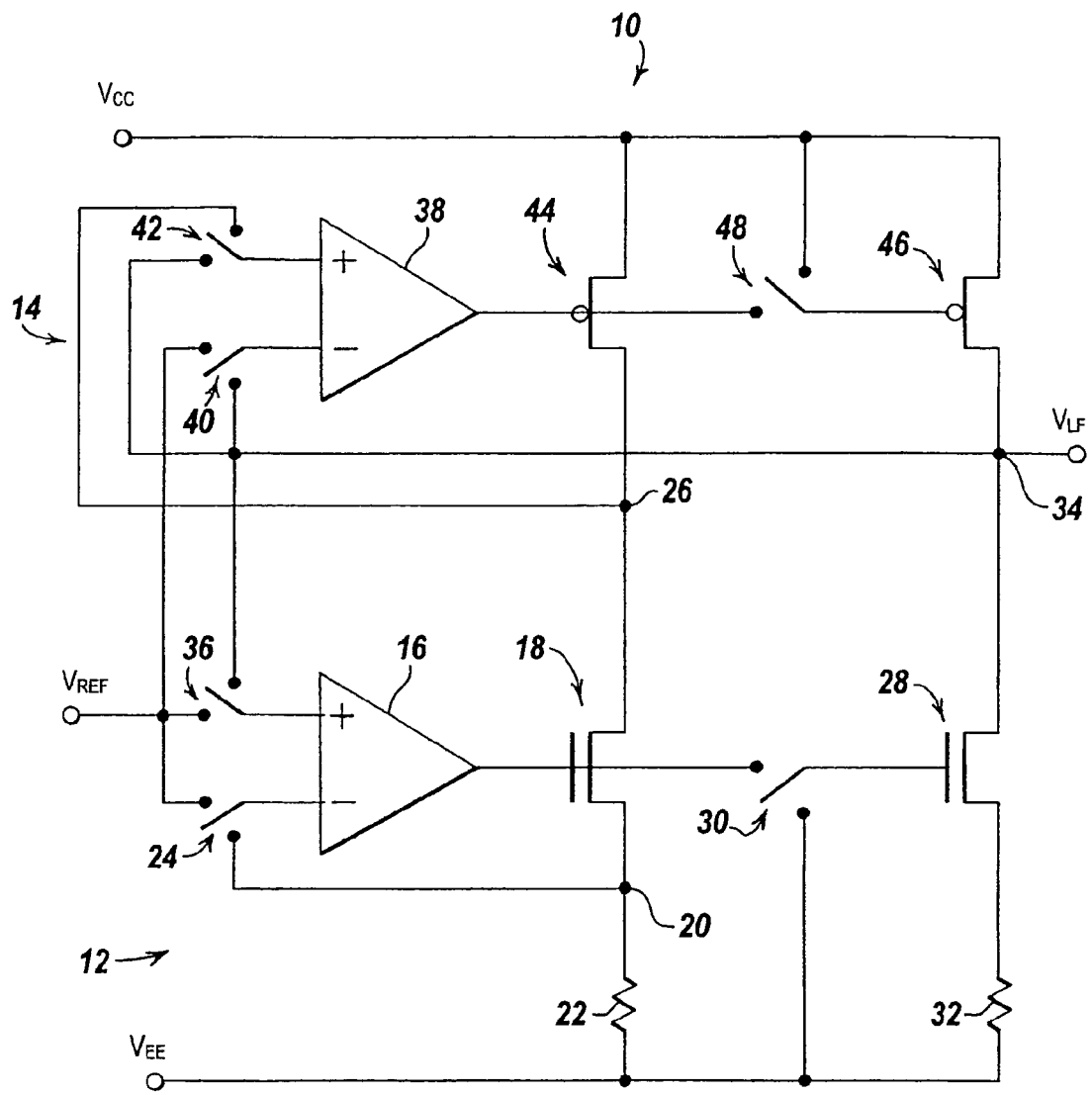
FIG. 2 shows an illustrative view of a charge pump circuit in accordance with an embodiment of the invention.

As shown in FIG. 2, a charge pump circuit 10 in accordance with an embodiment of the invention includes a reference portion 12 and a replication portion 14. The reference portion 12 includes an operational amplifier 16, the output of which is connected to a gate of an n-type MOSFET transistor 18. The source of the transistor 18 is connected to a node 20, which is turn is coupled to a low voltage supply $V_{EE}$ via a resistor 22 having a value $R_1$. The node 20 is also connected to the negative input of the operational amplifier 16 via a switch 24 when the switch 24 is in a first position during normal operation. The negative input of the operational amplifier 16 is coupled to a reference voltage $V_{REF}$ when the switch 24 is in a second reconfigured position. The drain of the transistor 18 is connected to a node 26, which couples together the reference portion 12 of the circuit 10 with the replication portion 14. The gate of the transistor 18 is also coupled to the gate of an output n-type MOSFET transistor 28 via a switch 30 when the switch 30 is in a first transistor coupling position. The gate of the output transistor 28 is coupled to $V_{EE}$ when the switch 30 is in a second transistor isolating position. The source of the output transistor 28 is coupled to $V_{EE}$ through a resistor 32 having a value $R_2$. The drain of the output transistor 28 is coupled to an output node 34 for the charge pump circuit 10. The output node 34 provides the output signal for the loop filter $V_{LF}$. The positive input of the operational amplifier 16 is coupled to the reference voltage $V_{REF}$ when a switch 36 is in a first position during normal operation, and is coupled to the output node 34 when the switch 36 is in a second reconfiguration position. The values of $R_1$ and $R_2$ may be the same as one another in an embodiment, or may be scaled with matching scaled transistors 18 and 28.

The replication portion 14 of the circuit 10 includes an operational amplifier 38, the negative input of which is coupled to the output node 34 when a switch 40 is in the first position during normal operation. The negative input of the operational amplifier 38 is coupled to the reference voltage $V_{REF}$ when the switch 40 is in the second reconfiguration position. The positive input of the operational amplifier 38 is coupled to the node 26 when a switch 42 is in the first position during normal operation, and is coupled to the output node 34 when the switch 42 is in the second reconfiguration position. The output of the operation amplifier 38 is connected to a gate of a p-type MOSFET transistor 44. The source of the transistor 44 is connected to a high voltage supply $V_{CC}$, and the drain of the transistor 44 is connected to the node 26. The gate of transistor 44 is also coupled to a gate of an output p-type MOSFET transistor 46 via a switch 48 when the switch 48 is in a first transistor coupling position. The gate of the output transistor 46 is coupled to $V_{CC}$ when the switch 48 is in a second transistor isolating position. The source of the output transistor 46 is connected to $V_{CC}$, and the drain of the output transistor 46 is connected to the output node 34.

The switches 24, 36, 40 and 42 may, for example, be minimum size MOSFET switches. In other embodiments, the switches may be implemented using other techniques such as bipolar technology. Although the illustrated embodiment includes n-type and p-type MOSFET transistors, those skilled in the art will appreciate that bipolar transistors may be used instead of the MOSFET transistors.

During normal operation, the switch 24 is in the first position connecting the negative input to the operational amplifier 16 to the node 20, the switch 36 is in the first position connecting the positive input of the operational amplifier 16 to the reference voltage $V_{REF}$, the switch 40 is in the first position connecting the negative input of the operational amplifier 38 to $V_{LF}$, and the switch 42 is in the first position connecting the positive input of the operational amplifier 38 to the node 26. The circuit operates to establish a bias current that is used as a fundamental current that may be switched to the output $V_{LF}$ to either increase the current to $V_{LF}$ (pump-up mode), decrease the current to $V_{LF}$ (pump-down mode), or in isolation mode where the output transistors 28 and 46 are isolated to generate high impedance.

In particular, and similar to the system described in U.S. Pat. No. 6,107,889 (the disclosure of which is hereby incorporated by reference), the pump-up mode is established when the switch 30 is in the second transistor isolating position connecting the gate of the transistor 28 to $V_{EE}$, and the switch 48 is in the first transistor coupling position connecting the gate of the transistor 44 to the gate of the transistor 46. The pump-down mode is established when the switch 30 is in the first transistor coupling position connecting the gate of the transistor 18 to the gate of the transistor 28, and the switch 48 is in the second transistor isolating position connecting the gate of the transistor 46 to $V_{CC}$. The isolation mode is established when the switches 30 and 48 are in the second transistor isolating position connecting the gate of the transistor 28 to $V_{EE}$ and the gate of the transistor 46 to $V_{CC}$.

The transistors 28 and 46 are the output devices for the circuit 10. Transistors 18 and 44 form the reference current loop where the voltage at the node 26 is forced to the voltage of the loop filter by the negative feedback action of the operational amplifier 38. The operational amplifier 16 sets up the fundamental current of the reference loop in the transistor 18 to be $V_{REF}/R_1$ by changing the gate voltage of the transistor 18 and compensates for the output impedance effects since the drain is set to $V_{LF}$. As the loop filter voltage varies, the operational amplifier 16 changes the gate voltage to maintain the fundamental current, which is also reflected into the transistor 44.

Figure 3:
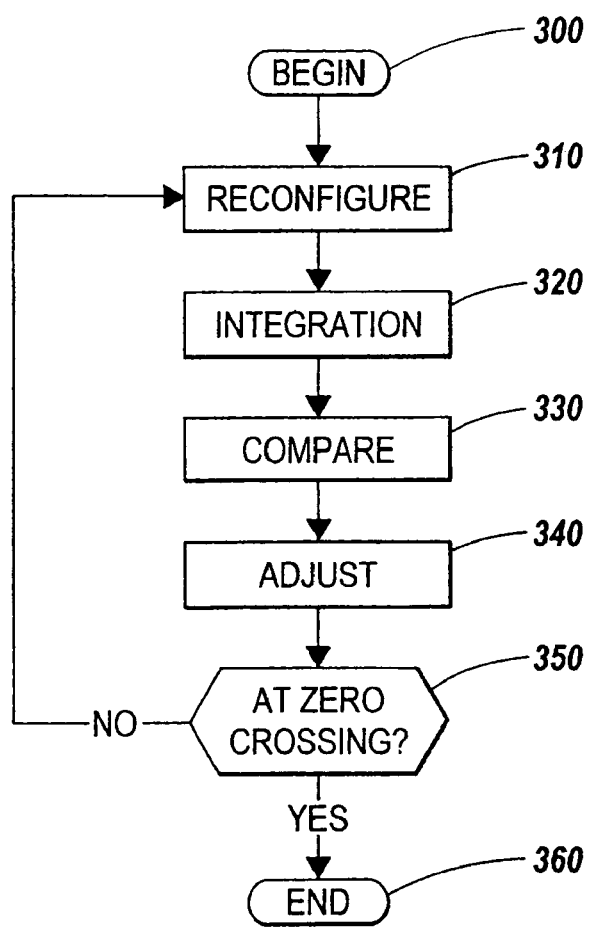
FIG. 3 shows an illustrative flowchart of the operation of the circuit of FIG. 2.

As shown in FIG. 3, the process of calibrating a phase locked loop in accordance with an embodiment of the invention begins (step 300) when a calibration routine is requested, such as at system start-up. The circuit 10 is then reconfigured (step 310) by changing the switches 24, 36, 40 and 42. Specifically, these switches are set to the reconfiguration position in which switch 24 connects the negative input of the operational amplifier 16 to $V_{REF}$, switch 36 connects the positive input of the operational amplifier 16 to $V_{LF}$, switch 40 connects the negative input of the operational amplifier 38 to $V_{REF}$, and switch 42 connects the positive input of the operational amplifier 38 to $V_{LF}$.

In the reconfiguration state, the charge pump now acts as a fully symmetrical and powerful voltage regulator. The voltage on the loop filter capacitor is brought to the voltage $V_{REF}$. The switches 24, 36, 40 and 42 are then switched back to their normal respective first positions.

The system then performs an integration (step 320) to sense any up/down current mismatch. This is achieved by activating the up and down currents simultaneously. Any resulting mismatch current (non-zero sum value) is then integrated into the PLL loop filter capacitance. This process provides that the calibration is achieved for the combination of the charge pump and the loop filter rather than for the charge pump alone.

After a predetermined time (e.g., 200 microseconds) the system then compares (step 330) the loop filter voltage to the $V_{REF}$ voltage. Responsive to this comparison, the current sources are slightly adjusted (step 340). The above steps (310–340) are repeated until the polarity of the mismatched current sum changes, indicating that it has crossed zero (step 350). Once the mismatch crosses zero, the calibration system ends (step 360).

Figure 4:
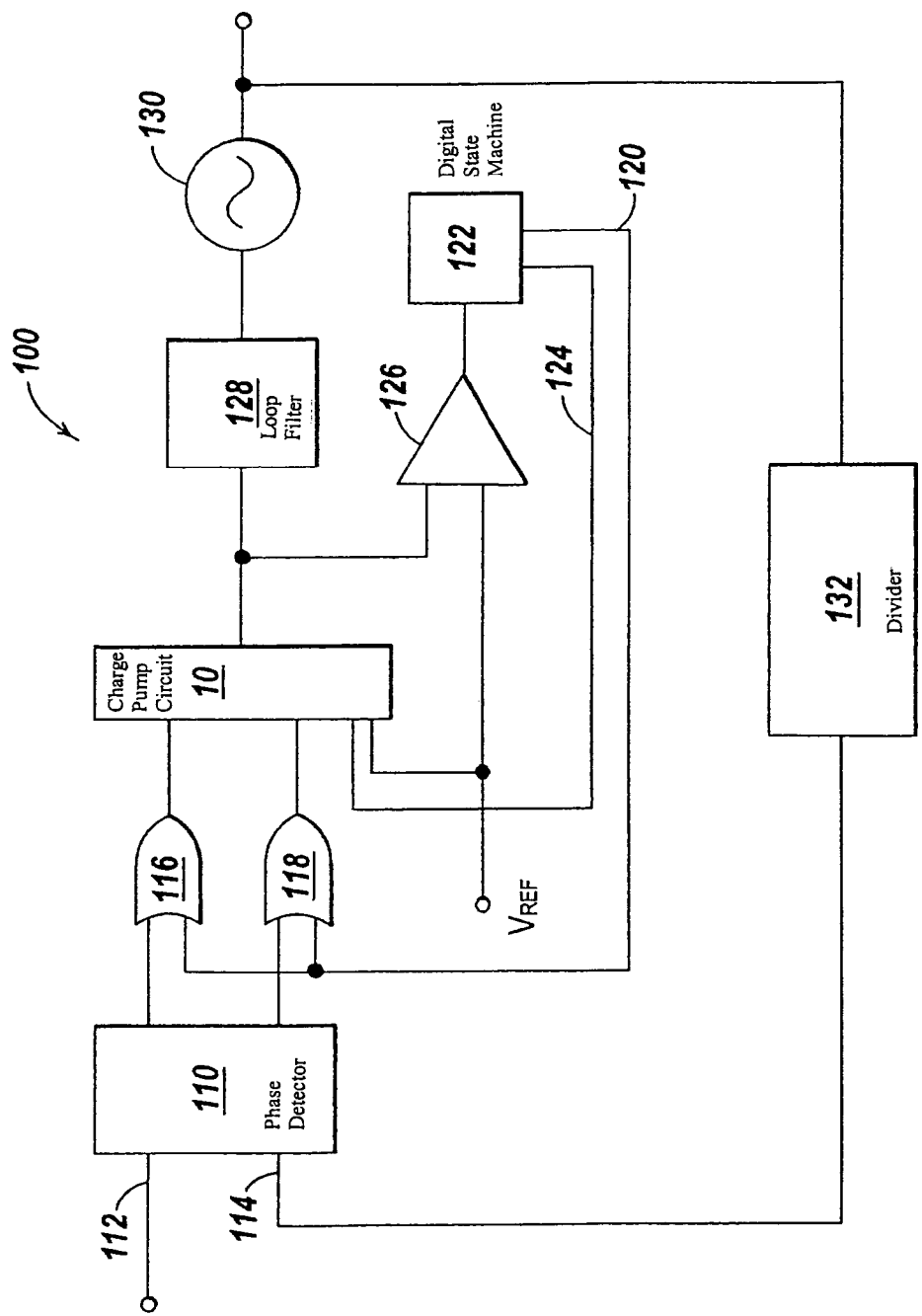
FIG. 4 shows an illustrative diagrammatic view of the functional relationship between components of a PLL frequency synthesizer including the charge pump circuit of FIG. 2.

As shown in FIG. 4, a charge pump circuit 10 of an embodiment of the invention may be used in a phase locked loop frequency synthesizer 100. In particular, the frequency synthesizer includes a phase detector 110 that receives a reference clock signal 112 and a feedback signal 114. The outputs of the phase detector provide up and down indicator signals that are respectively coupled to logical OR gates 116 and 118 respectively together with an OR gate disable signal 120 of a digital state machine 122. The outputs of the OR gates 116 and 118 are connected to the charge pump circuit 10, and a reconfiguration output signal 124 of the digital state machine 122 is also connected to the charge pump circuit 10.

The reference voltage signal $V_{REF}$ is connected to a comparator 126 as well as to the charge pump circuit 10. The output of the charge pump circuit 10 is connected to a loop filter 128 and is also connected to the comparator 126. The output of the loop filter 128 is connected to a voltage controlled oscillator 130, the output of which provides the output signal of the frequency synthesizer 100. This output signal of the frequency synthesizer is also fed back to the phase detector 110 as the feedback signal 114 after optionally passing first through a divider 132.

During normal operation, the phase detector 110 operates to detect the difference between the reference clock signal 112 and the feedback signal 114. In response to the difference in phase, the phase detector is set into one of a pump-up state, a pump-down state, or a high impedance state. The pump-up state is established if the phase of the reference clock signal 112 is found to be greater than that of the feedback signal 114. In this case, the phase detector 110 generates an up current signal that is sent to the OR gate 116. The output of the OR gate 116 controls the charge pump circuit by permitting a positive source current to the output of the charge pump circuit. The pump-down state is established if the phase of the reference clock signal 112 is found to be less than that of the feedback signal 114. In this case, the phase detector 110 generates a down current signal that is sent to the OR gate 118. The output of the OR gate 118 controls the charge pump circuit by permitting a negative source current to the output of the charge pump circuit. The high impedance state is established if the reference clock signal and feedback signal 114 have the same phase (phase locked condition). In this case, neither a positive or negative source current is generated, and the charge pump circuit 10 is configured to present a high impedance on the output of the charge pump circuit 10. The loop filter 128 serves to maintain a voltage for input to a voltage controlled oscillator 130. Accordingly, the synthesizer operates during normal operation to adjust the voltage controlled oscillator until the reference signal and the output signal are detected as being in phase, establishing that the synthesizer is in a phase locked condition.

During calibration, the digital state machine 122 generates a reconfiguration signal 124 that causes the switches 24, 36, 40 and 42 of the charge pump circuit 10 to be switched to their reconfiguration positions respectively as discussed above. The passage of the signals through the OR gates 116 and 118 is then blocked by setting the OR gate disable signal 120 of the digital state machine 122 to high (a non-zero value). The voltage on the loop filter is then brought to the voltage $V_{REF}$ as discussed above with reference to step 310 of FIG. 3. The switches 24, 36, 40 and 42 are then reset to their normal positions, and the system then performs an integration as discussed above with reference to step 320 of FIG. 3. After the integration step, the comparator 126 compares the output signal from the charge pump circuit 10 to the reference voltage signal $V_{REF}$ to determine whether a mismatch exists as discussed above with reference to step 330 of FIG. 3. If a mismatch exists, the system causes the charge pump circuit 10 to be slightly adjusted as discussed above with reference to step 340 of FIG. 3. In various embodiments, the charge pump circuit may be adjusted by increasing or decreasing the value of resistor 22 in FIG. 2. The above cycle repeats until the mismatch has been reduced to zero as discussed above with reference to step 350 of FIG. 3. The system then resumes normal operation and the OR gate disable signal is reset to the off non-blocking condition (e.g., zero volts).

The above system, therefore, permits a phase locked loop frequency synthesizer to be suspended from normal operation and calibrated to adjust for any mismatch in up/down currents that may exist due to the inherent characteristics of the circuit components, such as any mismatch between transistors 18 and 28, between transistors 44 and 46, between resistors 22 and 32, and between the inputs to each of the amplifiers 16 and 28. By making use of existing elements such as the loop filter (for error integration) and the charge pump (for loop filter pre-charge), the above calibration system involves negligible cost increases beyond the phase locked loop itself. Also, the above calibration system does not require an accurate analog circuit. Further, the above calibration system does not involve increasing the risk of undesired noise, such as may result by adding a switch between the charge pump output and the loop filter.

Those skilled in the art will appreciate that numerous modifications and variations may be made to the above disclosed embodiments without departing from the spirit and scope of the invention.

What is claimed is:

1. A charge pump circuit comprising:
    a reference current circuit including a first operational amplifier having a positive input port and a negative input port, said reference current circuit being operable for defining a reference current through a first biasing transistor and having a first low output impedance associated therewith, and being coupled to a first output transistor to provide a negative current to an output of the charge pump circuit;
    a replication feedback circuit including a second operational amplifier having a positive input port and a negative input port, said replication feedback circuit being coupled to said reference current circuit at a coupling node and operable for replicating said output voltage at said coupling node such that said reference current is defined in a second biasing transistor and having a second low impedance, and being coupled to a second output transistor to provide a positive current to the output of the charge pump circuit; and
    reconfiguration means for permitting the charge pump circuit to be reconfigured to couple the positive input ports of the first and second operational amplifiers to the output voltage of the charge pump circuit and to couple the negative input ports of the first and second operational amplifiers to a reference voltage.

2. The charge pump circuit as claimed in claim 1, wherein said charge pump circuit further includes calibration means for permitting the charge pump circuit to be adjusted to reduce to substantially zero any difference between the positive and negative currents to the output of the charge pump circuit.

3. The charge pump circuit as claimed in claim 1, wherein said reconfiguration means includes a plurality of switches for controlling the positive and negative input signals to the first and second operational amplifiers.

4. The charge pump circuit as claimed in claim 1, wherein said charge pump circuit further includes integration means for providing that the current difference is integrated into a phase locked loop filter capacitance.

5. The charge pump circuit as claimed in claim 2, wherein said charge pump circuit is used in a phase loop frequency synthesizer that includes a phase locked loop output and said calibration means is engaged when said phase locked loop output is not required during operation of the circuit.

6. A charge pump circuit comprising:
    a reference current circuit including a first operational amplifier having a positive input port and a negative input port, said reference current circuit being operable for defining a reference current through a first biasing transistor and having a first low output impedance associated therewith, and being coupled to a first output transistor to provide a negative current to an output of the charge pump circuit;
    a replication feedback circuit including a second operational amplifier having a positive input port and a negative input port, said replication feedback circuit being coupled to said reference current circuit at a coupling node and operable for replicating said output voltage at said coupling node such that said reference current is defined in a second biasing transistor and having a second low impedance, and being coupled to a second output transistor to provide a positive current to the output of the charge pump circuit;

a reconfiguration circuit including a plurality of switches for controlling the positive and negative input signals to the first and second operational amplifiers, said reconfiguration circuit for permitting the charge pump circuit to be reconfigured to couple the positive input ports of the first and second operational amplifiers to the output voltage of the charge pump circuit and to couple the negative input ports of the first and second operational amplifiers to a reference voltage; and calibration means for permitting the charge pump circuit to be adjusted to reduce to substantially zero any difference between the positive and negative currents to the output of the charge pump circuit.

7. The charge pump circuit as claimed in claim 6, wherein said charge pump circuit further includes integration means for providing that the current difference is integrated into a phase locked loop filter capacitance.

8. The charge pump circuit as claimed in claim 6, wherein said charge pump circuit is used in a phase loop frequency synthesizer that includes a phase locked loop output and said calibration means is engaged when said phase locked loop output is not required during operation of the circuit.

9. A charge pump circuit comprising:

a reference current circuit including a first operational amplifier having a positive input port and a negative input port, said reference current circuit being operable for defining a reference current through a first biasing transistor and having a first low output impedance associated therewith, and being coupled to a first output transistor to provide a negative current to an output of the charge pump circuit;

a replication feedback circuit including a second operational amplifier having a positive input port and a negative input port, said replication feedback circuit being coupled to said reference current circuit at a coupling node and operable for replicating said output voltage at said coupling node such that said reference current is defined in a second biasing transistor and having a second low impedance, and being coupled to a second output transistor to provide a positive current to the output of the charge pump circuit;

a reconfiguration circuit including a plurality of switches for controlling the positive and negative input signals to the first and second operational amplifiers, said reconfiguration circuit for permitting the charge pump circuit to be reconfigured to couple the positive input ports of the first and second operational amplifiers to the output voltage of the charge pump circuit and to couple the negative input ports of the first and second operational amplifiers to a reference voltage;

calibration means for permitting the charge pump circuit to be adjusted to reduce to substantially zero any difference between the positive and negative currents to the output of the charge pump circuit; and integration means for providing that the current difference is integrated into a phase locked loop filter capacitance.

10. The charge pump circuit as claimed in claim 9, wherein said charge pump circuit is used in a phase loop frequency synthesizer that includes a phase locked loop output and said calibration means is engaged when said phase locked loop output is not required during operation of the circuit.

* * * * *